United States Patent [19]
Siefker
[11] 3,867,759
[45] Feb. 25, 1975

[54] METHOD OF MANUFACTURING A MULTI-LAYERED STRIP TRANSMISSION LINE PRINTED CIRCUIT BOARD INTEGRATED PACKAGE

[75] Inventor: Robert G. Siefker, Cincinnati, Ohio

[73] Assignee: The United States of America as represented by the Secretary of United States Air Force, Washington, D.C.

[22] Filed: June 13, 1973

[21] Appl. No.: 369,654

[52] U.S. Cl. .................... 29/628, 29/625, 174/68.5, 317/101 B, 333/84 M
[51] Int. Cl. .................... H05k 3/36
[58] Field of Search .......... 29/624, 625, 203 B, 628, 29/203 L, 203 M, 203 W; 174/68.5, 174; 317/101 B; 333/84 M, 73 S

[56] References Cited

UNITED STATES PATENTS

| | | | |
|---|---|---|---|
| 2,907,925 | 10/1959 | Parsons | 117/212 |
| 3,350,498 | 10/1967 | Leeds | 174/68.5 |
| 3,371,249 | 2/1968 | Prohofsky | 174/68.5 X |
| 3,436,819 | 4/1969 | Lunine | 174/68.5 X |
| 3,516,156 | 6/1970 | Steranko | 29/627 |
| 3,541,223 | 11/1970 | Helms | 174/68.5 |
| 3,564,114 | 2/1971 | Blinder | 29/625 X |
| 3,638,573 | 2/1972 | Campbell | 174/68.5 X |

*Primary Examiner*—Richard J. Herbst
*Assistant Examiner*—Joseph A. Walkowski
*Attorney, Agent, or Firm*—Harry A. Herbert, Jr.; Arsen Tashjian

[57] ABSTRACT

The method of manufacturing the integrated package includes, but is not limited to, the steps of: fabricating a plurality of identical strip transmission line printed circuit board segments, which are to be used to form a plurality, preferably two, of printed circuit boards, with each board to be a layer in and of the multi-layered integrated package; joining the segments, which collectively constitute and define each circuit board layer, in coplanar relationship, to form the respective circuit boards, drilling, and plating with an electrically conductive material, a plurality of signal path holes in and through each segment of each circuit board (i.e., each layer); inserting one end of a different two-ended electrically conductive wire into each plated signal path hole in the first circuit board layer, and soldering that end in place to its respective plated signal path hole, thereby providing electrical contact by and between each wire and its respective plated hole in the first layer; inserting the other end of each wire in a different plated signal path hole in the second circuit board layer, and soldering that end in place to its respective plated signal path hole, thereby providing electrical contact by and between each end of each wire and the two plated signal path holes to which each wire is soldered, and also thereby providing electrical conductivity between, and from and to, the first and the second layers of printed circuit boards; and, bonding the second layer to the first layer in stacked relationship. By cascading the interconnection (i.e., adding a third layer to the two-layered package, and electrically interconnecting the third layer to the second layer), an integrated package of as many layers as desired or as needed may be formed, without having to penetrate more than any two adjacent layers of circuit boards at any one time. The method may be significantly varied, by performing additional steps to drill, plate and align one or more grounded holes in the circuit board layers, to improve the electrical performance of the transition.

2 Claims, 3 Drawing Figures

METHOD OF MANUFACTURING A MULTI-LAYERED STRIP TRANSMISSION LINE PRINTED CIRCUIT BOARD INTEGRATED PACKAGE

BACKGROUND OF THE INVENTION

This invention relates, generally, to a plurality of printed circuit boards which are fixedly joined and are positioned in stacked relationship; which are in electrical interconnection; and, which are structured as a single integrated multi-layer unit (or, as hereinafter referred to, as a "package"). More particularly, the invention relates to a preferred method of manufacturing the package hereinabove mentioned, wherein said package is adapted for use as a strip transmission line manifold assembly, such as an RF Distributive Manifold or as an IF Collection Manifold for what is referred to in the art as a "Reliable Advanced Solid State Radar," hereinafter referred to as "RASSR." As a metter solely of illustration, and not of any limitation, the invention will be described and shown as applied to a RF Distributive Manifold of a RASSR.

Strip transmission line printed circuit boards are well known in the art, as are multi-later printed circuit board structures per se. However, large scale phased arrays, such as the system which is known in the art as the "Molecular Electronics Radar Application" (hereinafter referred to as "MERA"), have shown the need for large scale, multi-layer stripline circuit load refinement.

It is fair and accurate to say that prior art multilayer RF circuit boards have been essentially of one of four types which may be referred to as: (1) the unlaminated pressure plate systems; (2) the standard low frequency multilayers; (3) the hybrid systems; and (4) the limited thickness chemically bonded packages.

The unlaminated systems are held together by pressure plates. This is the "traditional" approach and has been used for several years. The primary disadvantages of this system are: (1) the weight added by the pressure plates, said weight being typically from 50 to 75 percent of the total weight of the multi-layer assembly; and (2) the dependency of electrical performance on the pressure applied.

The standard low frequency multi-layer type of assembly involves the fabrication of the multi-layer package, followed by drilling and plating through holes as the method of interconnection. This technique, which is useful at low frequencies, has been attempted for use at radio frequencies. However, this technique is obviously frequency limited, due to the non-uniformity of the "stub" created by the "plated-through" hole barrel. An additional problem encountered is that the space necessary to lay out a given circuit on a given layer is restricted by the necessity of clearing areas used for connections on other layers. The standard "dot-master-dot" technique is inadequate, because of fringe field coupling, and one can literally run out of layout room as the circuitry approaches four or five layers. In general, this technique is limited, as a practical matter, to lower UHF use where electrical compromises are more readily tolerable.

In hybrid systems, each set of boards comprises a single stripline circuit and is bonded together, while the entire multi-layer assembly is held together mechanically. A substantial weight reduction is realized using this system but a complete elimination of press type plates for structural support is still impossible. Also intrinsic with this type of systems is the high failure rate associated with mechanical layer-to-layer connections.

In the limited thickness chemically bonded type of packages, it is possible to assemble two layers of RF circuitry in a multi-layer configuration using standard strappling or a "Z -wire" solder assembly. However, the only reliable way to use this assembly method for more than two layers is to use double registration of the circuitry. This introduces problems associated with very tight tolerance construction.

I have invented a novel method of manufacturing a multi-layer circuit board package which is useable in and as RF circuitry, and which said method obviates the known disadvantages of the prior art. The performance of the steps of my method results in a multi-layer circuit board integrated package which has no mechanical support requirements (other than mount requirements), which is highly reliable, and, most importantly, which can be very advantageously utilized to form a package of and with an arbitrary number of layers of circuit boards without having to penetrate more than any two adjacent layers of circuit boards at any one time. Therefore, I have significantly advanced the state-of-the-art.

SUMMARY OF THE INVENTION

My invention teaches a unique method of manufacturing a multi-layered strip transmission line printed circuit board integrated package.

Therefore, the principal object of this invention is to permit the manufacture of the aforesaid package and, of course, to permit said manufacture in an economically feasible manner.

Another object of this invention is to permit the manufacture of said package wherein the package may, as a matter of choice and/or of necessity, be structured of an arbitrary number (i.e., a potentially unlimited number) of layers of circuit boards without having to penetrate more than any two adjacent layers of circuit boards at any one time.

Still another object of this invention is to provide, as a result of the performance of the steps thereof, a circuit board integrated package which is highly reliable.

These objects, and still other related and equally important objects, of my inventive method will become readily apparent after a consideration of the description of the steps of my inventive method, coupled with reference to the drawings which include a pictorial representation of the result of the performance of the various steps of my inventive method. For example, yet another object of my inventive method is to provide a repeatable way of making the layer-to-layer mechanical and electrical transition from stacked circuit board to stacked circuit board, without having to penetrate more than the two layers to be interconnected.

DESCRIPTION OF THE INVENTIVE METHOD

1. Generally

My basic inventive method of manufacturing a multilayered printed circuit board integrated package includes (in the generic, broad, and most simple approach) 13 fundamental steps which, in appropriate circumstances, may be varied in number and/or in sequence and still achieve the desired end result.

As a preliminary matter, it is to be noted and to be remembered that my inventive method will be described herein as said method is adapted for use as a strip transmission line manifold assembly for an RASSR. Additionally, it is here again emphasized that such adaptation is solely by way of illustration, and not because of any limitation of my inventive method. Further, with reference to FIGS. 1, 2 and 3, it is to be assumed that strip transmission line printed circuit boards 10, FIGS. 1–3, and 20, FIGS. 2 and 3, and 30, FIG. 3, are to be fixedly positioned in stacked relationship, and in electrical interconnection, to form a multilayered intergrated package, with board 10 as the first layer, board 20 as the second layer, and board 30 as the third layer.

2. Specifically

Figures 1, 3:
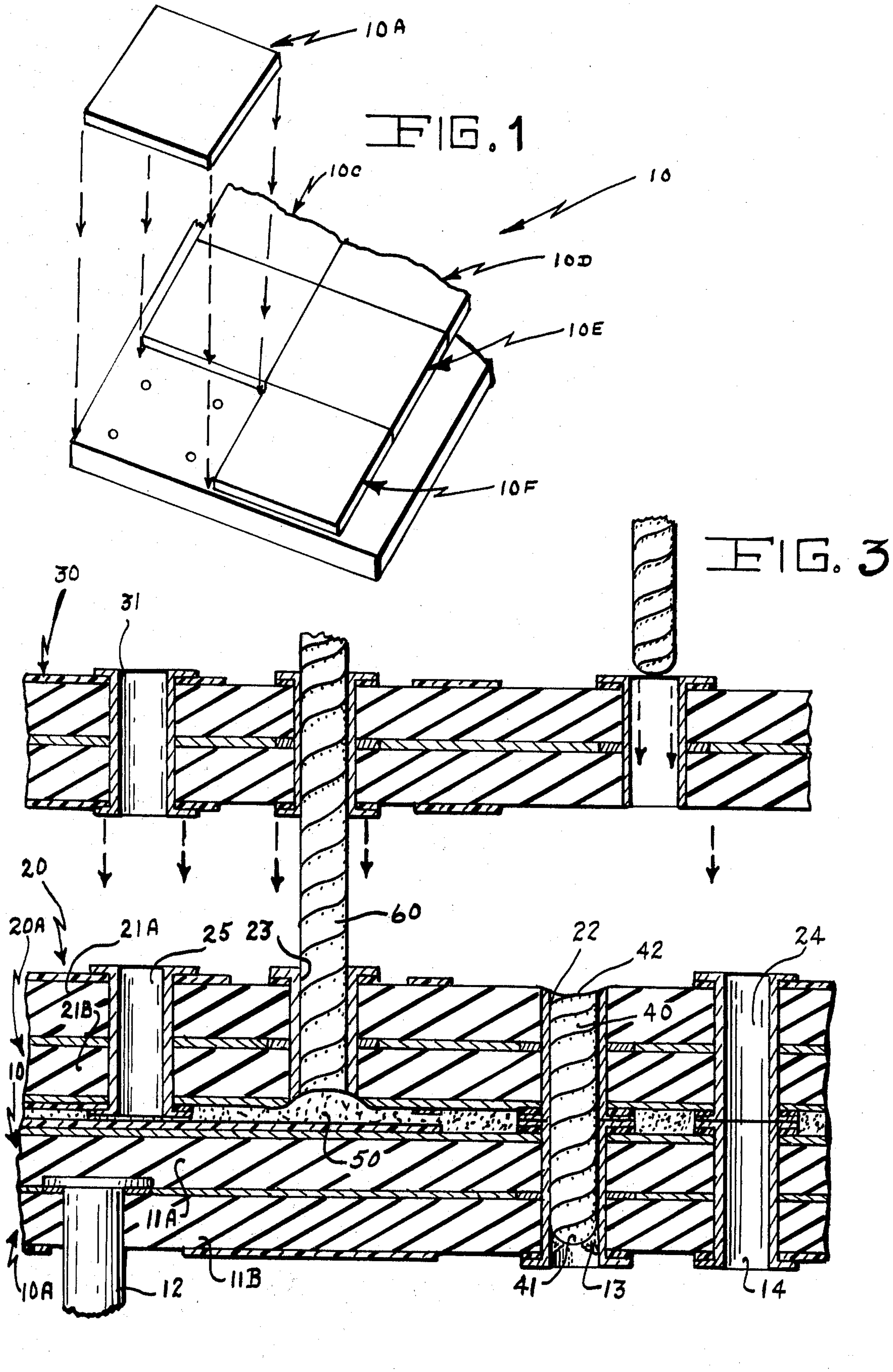
FIG. 1 is a perspective view, partially in schematic form and partially fragmented, showing how some of a plurality of segments, which collectively constitute and define a circuit board, are joined to form the particular circuit board and, simultaneously, also form a layer of the package manufactured by the use of my inventive method, in which said FIG. 1 one of the segments of the circuit board is shown being added, as indicated by the phantom lines, to the partially complete circuit board.

The 13 fundamental steps of my inventive method are:

Firstly, I fabricate a plurality of segments, such as 10A–10F, FIG. 1, which collectively constitute and define a first strip transmission line printed circuit board, such as 10, which is also in fact the first layer (i.e., the bottom layer in this situation) of the multi-layered integrated package to be formed. The segments, such as 10A-10F, are identical, but only as a matter of preference and solely to simplify the description of my inventive method herein. Also, as a related matter, each circuit board layer, such as 10, actually comprises two "halves": an upper portion, such as 11A of segment 10A, FIG. 2, and a lower portion, such as 11B of segment 10A, FIG. 2. Further, during the fabrication of the segments, the circuit is printed, or the like, on the portions, such as 11A and 11B, of each board segment, such as 10A. More specifically, the two "halves", such as 11A and 11B, have formed thereon one-half (more specifically, a portion) of the strip transmission line circuit, so that when the two halves are joined in adjacent registration, the strip transmission line circuit is formed thereby and therebetween. In essence, each one of the individual printed circuit board segments, such as 10A–10F, is made by conventional printed circuit, or the like, techniques. One or more pins, such as 12, FIGS. 2 and 3, may be made part of each segment for use as connector(s) for modular interconnection.

Next, I join by suitable means, such as by bonding, the first plurality of circuit board segments, such as 10A-10F, FIG. 1, preferably in the "picture puzzle" manner shown in FIG. 1. Thereby, the first transmission line printed circuit board, such as 10, is formed; and, the first layer of the multi-layered integrated package is also, and simultaneously, formed.

Figure 2:
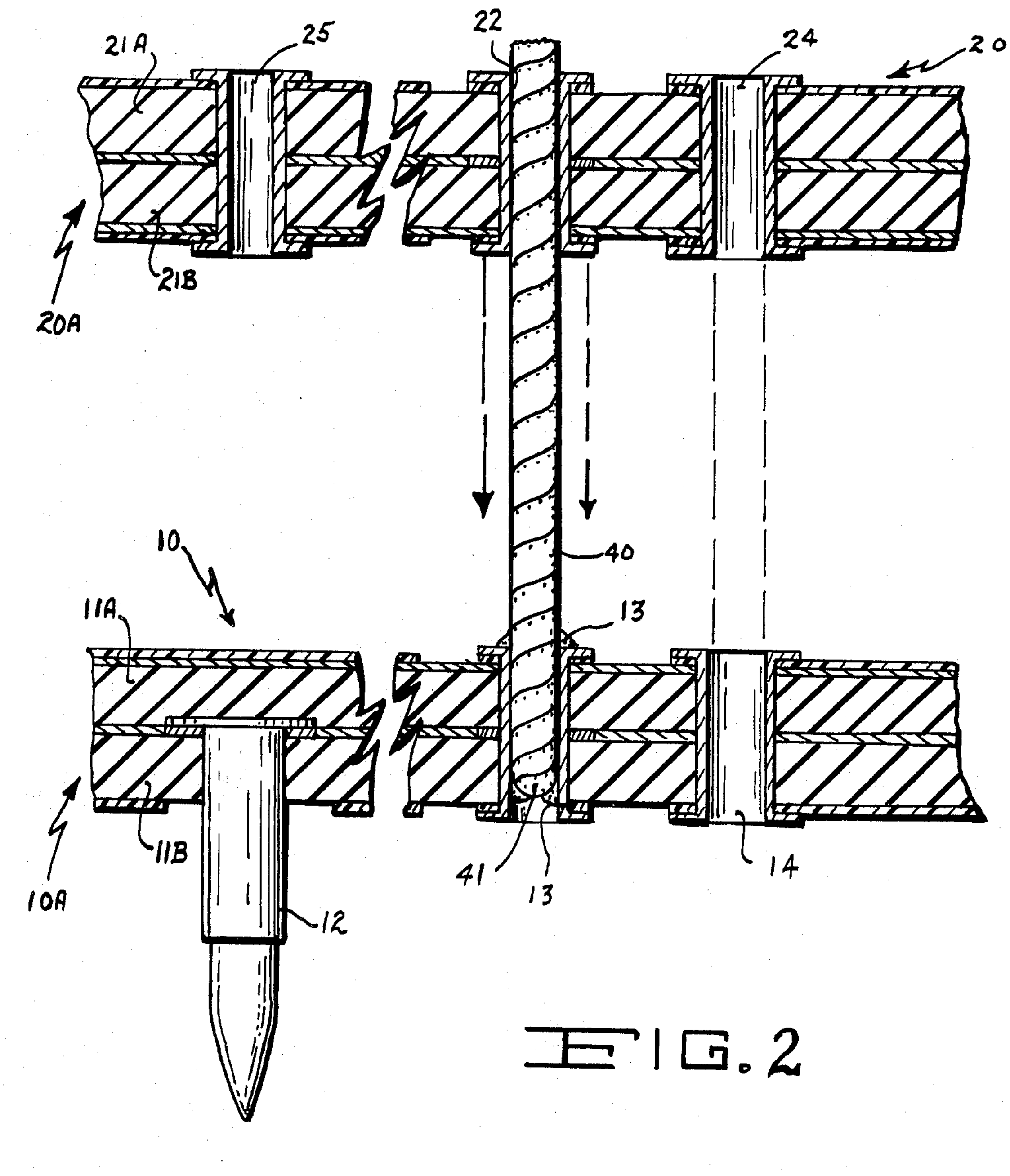
FIG. 2 is a side elevation view in schematic form, in cross section, and partially fragmented of two layers of circuit boards of the package manufactured by my method, showing in phantom how the second circuit board layer (i.e., the upper layer in FIG. 2) is positioned on the first circuit board layer, in stacked relationship and in electrical interconnection; and, FIG. 3 is also a side elevation view in schematic form, in cross section, and partially fragmented of three layers of circuit boards of the package manufactured by, and with the use of, my inventive method, showing in phantom how the third circuit layer (i.e., the uppermost layer in FIG. 3) is positioned on the second circuit board layer, also in stacked relationship and also in electrical interconnection.

Then, I fabricate a second plurality of identical segments, such as 20A, FIG. 2, which collectively constitute and define a second strip transmission line printed circuit board, such as 20, FIGS. 2 and 3. The fabrication of these segments, and the forming of this circuit board, is the same as described hereinabove with regard to the first strip transmission line printed circuit board 10, FIG. 1. Each segment, such as 20A, also comprises two halves (i.e., upper portion 21A and lower portion 21B, FIGS. 2 and 3).

Next, I join by suitable means, also such as by bonding, the second plurality of circuit board segments, also preferably in the picture puzzle fashion shown in FIG. 2. Thereby, the second transmission strip line printed circuit board, such as 20, FIGS. 2 and 3, is formed; and, the second layer of the multi-layered integrated package is formed at the same time.

Then, I drill a first plurality of signal path holes, such as 13, FIGS. 2 and 3, in and through each of the first plurality of circuit board segments, such as 10A, FIGS. 2 and 3, which form the first transmission line printed circuit board 10.

Next, I drill a second plurality of signal path holes, such as 22, FIGS. 2 and 3, and 23, FIG. 3, in and through each of the second plurality of segments, such as 20A, FIGS. 2 and 3, which form the second transmission line printed circuit board, such as 20, FIGS. 2 and 3.

Then, I plate, with an electrically conductive material, each signal path hole, such as 13, FIGS. 2 and 3, which has been drilled through each of the first plurality of segments, such as 10A, FIGS. 1–3, which form the first strip transmission line printed circuit board, such as 10, FIGS. 1–3.

Next, I also plate, with an electrically conductive material, each signal path hole, such as 22, FIGS. 2 and 3, and 23, FIG. 3, which has been drilled through each of the second plurality of segments, such as 20A, FIGS. 2 and 3, which form the second strip transmission line printed circuit board, such as 20, FIGS. 2 and 3.

Then, I insert a different electrically conductive stranded wire, such as 40, FIGS. 2 and 3, which has a first end 41, FIGS. 2 and 3, and a second end 42, FIG. 3, into each plated signal path hole, such as 13, in each of the first plurality of circuit board segments, such as 10A, with each wire inserted into its particular and individual signal path hole with its first end 41 in the hole first (hereinafter referred to as first-end-first).

Next, I affix in place, preferably by soldering, the first end, such as 41, to the hole, such as 13. Thereby, I provide electrical contact by and between the first end 41 of the wire 40 and the plated hole 13 in which the first end 41 is located.

Then, I feed the second end, such as 42, FIG. 3, of each wire, such as 40, into a different one, such as 22, FIGS. 2 and 3, of the plated signal path holes in each of the second plurality of circuit board segments, such as 20A, FIGS. 2 and 3, which form the second strip transmission line printed circuit board, such as 20, FIGS. 2 and 3.

Next, I affix in place, also preferably by soldering, the second end, such as 42, FIG. 3, of each wire, such as 40, to the plated signal path hole, such as 22. I, thereby, provide electrical contact and interconnection by and between the second end 42 of the wire 40 and the hole 22. Additionally, I also thereby provide electrical conductivity between the first strip transmission line printed circuit board, such as 10, and the second strip transmission line printed circuit board, such as 20, through hole 13 and wire end 41 to hole 22 and wire end 42, and vice versa.

Lastly, I bond the second strip transmission line printed circuit board, such as 20, to the first strip transmission line printed circuit board, such as 10, as shown in FIG. 3, in stacked relationship. The bonding agent is generally designated, in FIG. 3, by the reference numeral 50 for easy identification.

As a result of the performance of the foregoing fundamental steps of my inventive method, the desired multi-layered strip transmission line printed circuit board integrated package is formed.

As can be easily seen by an inspection of FIGS. 1–3, by cascading the interconnection operation, one can continue through an indeterminant (i.e., an unlimited, or arbitrary) number of circuit board layers, thereby forming an integrated package of as many layers, in stacked relationship, as may be desired and/or needed. For example, and with reference to FIG. 3, one can see from an examination of said Figure that printed circuit board 30 can be electrically interconnected with and to printed circuit board 20, by the use of my inventive method, with wires, such as 60. Such interconnection also electrically interconnects boards 10 and 30, and results in a tri-level multi-layered integrated package.

It is to be noted, however, that since the characteristic impedance of a single post is very high, the electrical performance of the transition can be improved by adding one or more grounded plated-through holes, such as 14 of circuit board 10, FIGS. 2 and 3, such as 24 and 25 of circuit board 20, FIGS. 2 and 3, and such as 31 of circuit board 30, FIG. 3. The holes parallel the signal path and connect the ground planes. These holes serve to suppress the propagation of parallel plane transverse electric (TE) or transverse magnetic (TM) modes at frequencies above cut-off, as well as serving to provide an *h* -wire transmission line for improved impedance match. The exact number and configuration of these ground holes or lines are functions of frequency, material choice, available space, and required impedence.

To provide for these ground holes or "lines", my inventive method can be varied to comprise the additional steps of:

Firstly, drilling a first plurality of ground path holes in and through each of the first plurality of segments which form the first strip transmission line printed circuit board, with the ground path holes paralleling the signal path holes.

Next, drilling a second plurality of corresponding (i.e., axially aligned) ground path holes in and through each of the second plurality of segments which form the second strip transmission line printed circuit board, with these ground path holes also paralleling the signal path holes.

Then, plating, with electrically conductive material, each ground path hole drilled through each of the first plurality of segments which form the first transmission line printed circuit board.

Lastly, plating, with electrically conductive material, each corresponding ground path hole drilled through each of the second plurality of segments which form the second strip transmission line printed circuit board.

CONCLUSION

From all of the foregoing, it is readily apparent that the objects of my inventive method have been attained.

Additionally, while there have been shown and described the unique and fundamental steps of my inventive method, as set forth not only in the basic method taught herein, but also as set forth in the variation thereof and in the particular adaptation thereof disclosed hereinabove, it is to be understood that other variations and other adaptations of my basic inventive method can be made by those of ordinary skill in the art, without departing from the spirit of the invention.

What I claim is:

1. A method of manufacturing a multi-layered strip transmission line printed circuit board integrated package, as adapted for use as a strip transmission line manifold assembly, wherein at least a first strip transmission line printed circuit board and a second strip transmission line printed circuit board are to be fixedly joined and positioned in stacked relationship and in electrical interconnection, to form the multi-layered integrated package, comprising the steps of:

a. fabricating a first plurality of segments which collectively constitute and define the first strip transmission line printed circuit board;

b. joining the first plurality of segments in coplaner relationship, whereby the first strip transmission line printed circuit board is formed, and whereby the first layer of the multi-layered integrated package also is formed;

c. fabricating a second plurality of segments which collectively constitute and define the second strip transmission line printed circuit board;

d. joining the second plurality of segments in coplaner relationship, whereby the second strip transmission line printed circuit board is formed, and whereby the second layer of the multi-layered integrated package is also formed;

e. drilling a first plurality of signal path holes in and through each of the first plurality of segments which form the first strip transmission line printed circuit board;

f. drilling a second plurality of signal path holes in and through each of the second plurality of segments which form the second strip transmission line printed circuit board;

g. plating, with an electrically conductive material, each signal path hole drilled through each of the first plurality of segments which form the first strip transmission line printed circuit board;

h. plating, with an electrically conductive material, each signal path hole drilled through each of the second plurality of segments which form the second strip transmission line printed circuit board;

i. inserting a different electrically conductive stranded wire having a first end and a second end into each plated signal path hole in each of the first plurality of segments which form the first strip transmission line printed circuit board, with each said electrically conductive stranded wire inserted into its particular and individual signal path hole in first-end-first position;

j. soldering, in place, said first end of each of said different electrically conductive stranded wires, thereby providing electrical contact by and between each first end of each of said conductive wires and the plated hole in which said first end is located;

k. feeding the second end of each different electrically conductive wire into a different one of the plated signal path holes in each of the second plurality of segments which form the second strip transmission line printed circuit board;

l. soldering, in place, said second end of each of said different electrically conductive stranded wires, thereby providing electrical contact by and between each second end of each of said conductive wires and the plates hole in the second printed circuit board in which said second end is located, and also thereby providing electrical conductivity between said first and said second strip transmission line printed circuit boards;

m. and, bonding said second strip transmission line printed circuit board to said first strip transmission line printed circuit board in stacked relationship; whereby the desired multi-layered strip transmission line printed circuit board integrated package is formed; and, whereby by cascading the interconnection, an integrated package of as many layers as desired may be formed without having to penetrate more than two adjacent layers of circuit boards at any one time.

2. The method, as set forth in claim 1, wherein said method comprises the additional steps of:

a. drilling a first plurality of ground path holes in and through each of the first plurality of segments which form the first strip transmission line printed circuit board, wherein said ground path holes parallel the signal path holes;

b. drilling a second plurality of corresponding ground path holes in and through each of the second plurality of segments which form the second strip transmission line printed circuit board, wherein said ground path holes also parallel the signal path holes;

c. plating, with electrically conductive material, each ground path hole drilled through each of the first plurality of segments which form the first strip transmission line printed circuit board;

d. and, plating, with electrically conductive material, each corresponding ground path hole drilled through each of the second plurality of segments which form the second strip transmission line printed circuit board;

thereby forming ground lines.

* * * * *